US010343332B2

(12) United States Patent
Mappes et al.

(10) Patent No.: US 10,343,332 B2
(45) Date of Patent: Jul. 9, 2019

(54) PRODUCTION OF 3D FREE-FORM WAVEGUIDE STRUCTURES

(71) Applicant: Karlsruher Institut für Technologie, Karlruhe (DE)

(72) Inventors: Timo Mappes, Karlsruhe (DE); Sebastian Köber, Leichlingen (DE); Nicole Lindenmann, Karlsruhe (DE); Christian Koos, Siegelsbach (DE)

(73) Assignee: Karlsruher Institut Fur Technologie (DE)

( * ) Notice: Subject to any disclaimer, the term of this patent is extended or adjusted under 35 U.S.C. 154(b) by 637 days.

(21) Appl. No.: 14/780,134

(22) PCT Filed: Mar. 28, 2014

(86) PCT No.: PCT/EP2014/000841
§ 371 (c)(1),
(2) Date: Sep. 25, 2015

(87) PCT Pub. No.: WO2014/154363
PCT Pub. Date: Oct. 2, 2014

(65) Prior Publication Data
US 2016/0046070 A1    Feb. 18, 2016

(30) Foreign Application Priority Data
Mar. 28, 2013 (DE) .......... 10 2013 005 565

(51) Int. Cl.
*B29C 64/135* (2017.01)
*B29C 71/02* (2006.01)
(Continued)

(52) U.S. Cl.
CPC ............ *B29C 64/135* (2017.08); *B29C 71/02* (2013.01); *B29D 11/00663* (2013.01);
(Continued)

(58) Field of Classification Search
CPC .................................................. B29C 64/135
See application file for complete search history.

(56) References Cited

U.S. PATENT DOCUMENTS 5,846,694 A    12/1998   Strand et al.
7,024,093 B2    4/2006   Shelnut et al.
(Continued)

FOREIGN PATENT DOCUMENTS

DE    102007038642    2/2009
EP    1377853    1/2004
(Continued)

OTHER PUBLICATIONS

Grossman, T et al.: "High-Q conical polymeric microcavities" (In: Applied Physics Letters 96, 013303 (2010), pp. 013303-1-013303-3).
(Continued)

*Primary Examiner* — Larry W Thrower
(74) *Attorney, Agent, or Firm* — Onello & Mello LLP

(57) ABSTRACT

The present invention provides a process for producing an optical waveguide (20) more particularly for integrated photonic systems. This process comprises provision of polymerizable material; local polymerization of the polymerizable material to produce a multiplicity of polymerized structural elements (14); removal of the unpolymerized regions of the polymerizable material; and heating of the polymerized material more particularly above the glass transition temperature thereof in order to fuse the multiplicity of polymerized structural elements (14) together to form the optical waveguide (20).

19 Claims, 2 Drawing Sheets

(51) Int. Cl.
  *B29D 11/00* (2006.01)
  *G02B 6/138* (2006.01)
  *G02B 6/30* (2006.01)
  *G02B 6/122* (2006.01)
  *G03F 7/038* (2006.01)
  *G03F 7/20* (2006.01)
  *B29K 105/00* (2006.01)
  *B29L 11/00* (2006.01)

(52) U.S. Cl.
  CPC ........... *G02B 6/1221* (2013.01); *G02B 6/138* (2013.01); *G02B 6/305* (2013.01); *G03F 7/038* (2013.01); *G03F 7/70375* (2013.01); *B29C 2071/022* (2013.01); *B29K 2105/0002* (2013.01); *B29L 2011/0075* (2013.01)

(56) References Cited

U.S. PATENT DOCUMENTS

| | | | |
|---|---|---|---|
| 7,039,264 B2 | 5/2006 | Bryan et al. |
| 7,057,832 B2 | 6/2006 | Wu et al. |
| 7,403,338 B2 | 7/2008 | Wu et al. |
| 8,541,050 B2 | 9/2013 | Nakashiba et al. |
| 8,903,205 B2 | 12/2014 | Koos et al. |
| 9,034,222 B2 | 5/2015 | Koos et al. |
| 2004/0126694 A1 | 7/2004 | Devoe et al. |
| 2005/0208431 A1 | 9/2005 | Devoe et al. |

FOREIGN PATENT DOCUMENTS

| | | | |
|---|---|---|---|
| EP | 1434068 | | 6/2004 |
| EP | 1635202 | * | 3/2006 |
| EP | 2269103 | | 1/2011 |
| JP | 07100938 | | 4/1995 |

OTHER PUBLICATIONS

International Search Report dated Jun. 17, 2014 issued in corresponding International Application No. PCT/EP2014/000841.
Lindenmann, N., et al., "Photonic wire bonding: a novel concept for chip-scale interconnects" (In: Optics Express, vol. 20, pp. 17667-17677 (2012)).
Lindenmann, N., et al., "Photonic Wire Bonding for Single-Mode Chip-to-Chip Interconnects" (In: 8th IEEE International Conference on Group IV Photonics (GFP), Sep. 14-16, 2011, pp. 380-382).
International Preliminary Report on Patentability dated Sep. 25, 2015 in corresponding international patent application PCT/EP2014/000841.

* cited by examiner

PRODUCTION OF 3D FREE-FORM WAVEGUIDE STRUCTURES

The present invention relates to the field of micro-optics and nano-optics, namely waveguide structures, in particular to the optical connection of integrated photonic systems between each other (chip to chip connections) and to the connection of integrated photonic systems to glass fibers (fiber to chip connections). The invention particularly relates to a method for producing such waveguide structures.

For some years the field of integrated photonics, in particular the integration of photonics into established silicon chip technology, has been a very active field of research and has promised considerable practical benefits in the combination and fusion together of electronic and optical data transmission and data processing. Consequently, nano-photonic systems of great complexity and a multiplicity of functions can be implemented and industrially produced in an extremely small space.

However, over and over again, the optical connections between individual photonic systems represent a substantial hurdle in commercial implementation. As a result, requirements are made on both the positioning accuracy and the quality, or respectively the optical quality, of such optical connections, which are hard to achieve with production processes that can be implemented in the production of highly-integrated circuits. In any event, optical connections based on conventional glass fibers for example, which are coupled direct to a chip, require a large number of process steps, which are either impossible or difficult to automate, and lead to relatively low integration densities of chip to chip connections. This in turn leads to high production and unit costs.

Hence the technology of optical connections for integrated photonic systems is of crucial significance for the development of photonic circuits. In this connection there was a series of various approaches to improving the production of photonic connecting waveguides in integrated photonic systems.

U.S. Pat. No. 5,846,694 describes a planar structuring of waveguides. In this case a substrate is first lithographically structured, onto which the waveguide material is deposited. The substrate is pre-structured in such a way that the molten waveguide material only coats the substrate along the desired course thereof, not the rest of the surface of the component however. Similar planar waveguide structures are also proposed in EP 1 434 068 A2 and U.S. Pat. No. 7,024,093 B2. However, therein the waveguide material is directly structured planar-lithographically. A planar-lithographic structuring of the waveguide material is also applied in EP 2 269 103 A1.

An entirely different approach to producing a waveguide is proposed in DE 10 2007 038 642 B4. In this case a thick layer is first produced from organic material. This organic material is changed with a focused beam of light along a desired course of the waveguide to be produced, in such a way that the refraction index of the material changes in the focus of the laser beam. Thus the desired path described by the laser focus acts as a light waveguide. Consequently, unlike the methods described above, this method neither relies on nor is it restricted to conventional planar-lithographic technologies with reference to the course and the geometry of the waveguide for example. However, in this approach the refractive index contrast required by the guiding of the waves is restricted.

For applications as chip to chip connections, a technologically particularly interesting approach to the optical connection of integrated photonic circuits between each other is described in "Photonic wire bonding": a novel concept for chip-scale interconnects" by Lindenmann et al., Optics Express, vol. 20, pp. 17667 ff. Therein a focused laser is used to illuminate a photo resist locally, and thus to initiate a local polymerization. By moving the laser focus within the volume of the photo resist, the laser thus accurately "copies in writing" the desired geometry of a waveguide to be produced. As a result, the polymer which develops here forms the waveguide directly. Even though this method is time-consuming due to the serial process character thereof, the fact that it enables the precise control and guiding of the laser focus allows the production of considerable homogeneity of the waveguide material and a waveguide surface of very low roughness.

Besides the previously mentioned requirements for the precision and quality of the waveguide structures to be produced and as higher an integration density as possible thereof, a further requirement for a commercial implementation is the shortening of process times. Whereas conventional parallel production processes often restrict the possible geometry of the structures, serial structural technology requires relatively long process times even though the precision and above all the flexibility in the achievable geometries can be better there.

The object of the present invention is to improve the optical quality of waveguide structures and, at the same time, the high degree of freedom in the achievable geometries of the waveguide course, and to do so in short process times. This object is achieved by a method with the characteristics stated in claim 1. Preferred embodiments are the subject of the dependent claims.

Consequently, the invention particularly offers a method for producing an optical waveguide, wherein an (optical) polymerizable material is first provided in a non-polymerized state. In particular, as a layer this material can be applied or deposited at least in the area in which the waveguide structure is also to be produced. This polymerizable material is then locally polymerized in a multiplicity of positions, whereby a multiplicity of polymerized structural elements are created, which form a raw structure for the waveguide to be produced. In particular the polymerized structural elements as a whole approximately correspond to the waveguide to be produced, without already having the required or desired homogeneity of the material and the required or desired smoothness of the structural borders. However, the whole volume of the polymerized material of the produced structural elements which emulate the waveguide to be produced, substantially corresponds to the volume of the waveguide to be produced. However, gaps can also still occur between the individual structural elements, in which there is also not yet polymerized material. But the polymerized structural elements are produced along the whole course of the waveguide to be produced and they are connected in such a way that, as raw structure of the waveguide, they are still sufficiently self-supporting even after a removal of the non-polymerized material surrounding them.

In a preferred embodiment the local polymerization comprises an illumination with focused laser light. As a result, the polymerized structural elements can be positioned particularly precisely. Additionally, the high energy density of the light in the focus of the laser beam enables very fast local polymerization. Above all, however, the focus can be positioned and changed within a volume of the polymerizable material in any way required, whereby the polymerization process takes place substantially only in the area of the laser focus. Hence any three-dimensional free-form structures required can be formed within the volume of the polymerizable material. In particular, the focus of the laser beam is preferably scanned in the manner of a grid relative to the polymerizable material, at least in the area of the waveguide to be produced. Most preferably, the polymerized structural elements along the path of the focus are produced as structural elements shaped like lines. Preferably a grid of parallel processing lines is provided, along which the laser focus is moved in succession whereby the laser light is only radiated and therefore the polymerization process is only carried out where the processing lines run within a volume area of the polymerizable material, in which the waveguide is to be produced.

After the local polymerization, the non-polymerized areas of the polymerizable material are removed and the polymerized material is retained. Therefore the non-polymerized material is removed selectively. This can be done via a wet chemical process for example, using a solvent which acts selectively. For this, recourse can be had to many processes known from lithography. Particularly, as raw structure of the waveguide to be produced, the previously polymerized areas remain particularly self-supporting. Examples of polymerizable materials and corresponding solvents (developers) will be discussed later.

At this point the invention proposes heating the polymerized material, that is, the developed raw structure of the waveguide, in such a way that the polymerized structural elements within a raw structure of a waveguide to be produced fuse together to form the optical waveguide. In this case, the raw structure (that is, the polymerized structural elements) is heated in such a way that, due to the onset of the glass transition of the polymeric (polymerized) material, it is smoothed by lowering the surface energy and particularly becomes more homogeneous in the interior, without the polymeric material melting however. Hence it is not heated up to the melting temperature of the polymeric material. The basic outer geometry of the course of the self-supporting raw structure is thereby retained while, by means of the homogenization of at least part of the surface of the interior and a smoothing of at least part of the surface, the desired waveguide is formed out of the raw structure. In this case the temperature and duration of the heating processes can be selected in such a way that the desired lowering of the surface roughnesses and the desired homogenization of the waveguide material is achieved.

In particular the heating comprises heating up to a temperature above the glass transition temperature but below the melting temperature of the polymerized material. In this connection particularly the temperature, at which, in a Dynamic Mechanical Analysis (DMA), the imaginary part (also known as the loss module) of the elasticity module reaches a maximum, is regarded as the glass transition temperature of the polymer used. For this, additional reference is also made to standard DIN EN 61006:2004-11.

Thus the invention offers a very flexible method for producing optical connections of photonic components by means of polymeric free-form structures, which can be adapted to suit geometric requirements. Consequently, in particular freely definable wave-guiding structures between particularly planar integrated photonic components can be produced by means of a three-dimensional direct-writing lithography process. This delivers both low-loss optical connections between integrated photonic structures (chip to chip coupling) and connections between optical fibers and photonic structures (fiber to chip coupling).

The proposed method uses a local polymerization process which, in particular, is induced in the focus of a preferably pulsed laser beam preferably by means of multiple photon absorption. The local polymerization process allows the precise control of the three-dimensional structure of the waveguide to be produced, in that the raw structure already emulates the desired course of the waveguide, although without already having to have the necessary or desired inner homogeneity and/or the necessary or desired smoothness of the final waveguide. Therefore the polymerization process does not have to completely or homogeneously cover the entire volume of the waveguide to be produced. On the contrary, individual polymerized structural elements, such as individual polymerized channels or threads produced along the path of a laser focus (here also termed writing line) can be provided a distance apart from each other in such a way that merely a sufficient overlap of the polymerized material develops in such a way that the entire developing raw structure remains self-supporting even after removal of the surrounding non-polymerized material and does not degrade into the individual structural elements.

Particularly when a scanning laser focus is used, the local polymerization causes the production of discrete, three-dimensional, ellipsoid structures known as voxels within the polymerizable material (photo resist). What are known as voxel lines are written into the material in the writing direction, that is, along the writing lines. At this point, by means of an adapted illumination strategy, a continuous, wave-guiding free-form structure can be produced from a multiplicity of these voxel lines. In this case, in a further process step, non-polymerized photo resist is detached from polymerized areas by means of a suitable developer, hence a free-standing three-dimensional structure (the raw structure) is produced.

Consequently, the present invention offers a very efficient combining of the quality of the produced structures on the one hand, both in terms of surface smoothness and material homogeneity within the volume of the polymerized material, and the required writing time or respectively illumination duration for finally producing the waveguide on the other. The latter can be kept relatively short, by using the present invention with a view to the commercial benefits of the technology. Thus, by selecting relatively wide distances between voxel lines, it is possible to keep the necessary writing time relatively short, which inevitably results in inhomogeneities in the volume of the material or respectively to a rough surface of the raw structure. Although this would result in light diffusion and therefore propagation losses and poor optical output of the resulting raw structure, by subsequently heating the raw structure, particularly above the glass transition temperature, it is possible to produce the desired optical characteristics of the waveguide very efficiently.

Hence the present invention offers a very effective and at the same time very sound, highly reproducible possibility of preventing or respectively reducing optical deterioration of waveguide structures to be produced, even when these are produced at high writing speed and with correspondingly wide distances between adjacent voxel lines. In this case an individual waveguide to be produced is produced from a multiplicity of individual, but at least in part adjacent or respectively overlapping, polymerized structural elements.

In a preferred embodiment the local polymerization is optically induced by multiple photon absorption. The non-linear optical process of multiple photon absorption enables the production of three-dimensional free-form structures with particularly high spatial resolution and preferably additionally creates very sharp transitions between the polymerized and the non-polymerized material. The multiple photon absorption process is preferably further supported by the use of a pulsed laser, since it is precisely by the use thereof that especially high energy densities can be achieved, in the laser focus, which support this non-linear optical process. In this case the fact that very good selective removal of the non-polymerized material is brought about and also, during the heating, the very good fusing of the structural elements to the waveguide, particularly in terms of the achievable homogeneity of the waveguide material, is advantageous for precisely the procedure according to the invention.

The local polymerization preferably takes place along a multiplicity of processing lines running parallel to each other in a regular grid within an area of the optical waveguide to be produced. Here, the processing lines (writing lines) form the course of the center of the laser focus, that is, the center of the path, along which the polymerization takes place. Therefore it is not necessary (although certainly also possible in another embodiment) for the writing lines to follow directly the basic course of the waveguide to be produced or respectively run parallel thereto. Instead, the positions or respectively distances and the course of the writing lines can be arranged independently of the freely selectable, three-dimensional form of the waveguide in a firmly specified grid. Particularly, the laser focus can always be scanned perpendicular to the beam direction, for example along the writing lines.

The polymerized structural elements preferably form line elements (linear, polymerized channels or threads), which have a cross section perpendicular to a longitudinal extension of the line elements, which is in the range of about 100 nm to about 2 µm. Particularly the diameter or respectively cross-section of the polymerized structural elements or respectively line elements can be defined by the effective expansion of the laser focus. For example, in a typical Gaussian intensity distribution of a laser focus the lateral resolution will be higher, that is, the lateral expansion of the laser focus lower, than the axial one. Hence the polymerized structural elements will preferably have greater expansion in the axial direction of the laser beam than in the lateral direction. In writing lines perpendicular to the beam direction the writing lines adjacent to each other in the axial direction of the laser can have a greater distance between each other than the writing lines adjacent in the lateral direction. Adjacent processing lines preferably have a distance between each other in the range of about 50 nm to about 3 µm, preferably in the range of about 100 nm to about 2 µm, still more preferably in the range of about 200 nm to about 1 µm, most preferably in the range of about 200 nm to about 500 nm. The mean diameter or respectively cross section of the waveguide to be produced, or the local diameter or respectively cross section thereof, is, at least in areas, twice as great as the mean diameter or respectively cross section of the individual polymerized structural elements which form the waveguide.

In a further preferred aspect, an atmosphere of dopant is provided during the heating. This dopant can at least in part preferably diffuse into of the polymerized material during the heating. The dopant can be provided in different ways. In a preferred embodiment, the method comprises coating the polymerized material with dopant before the heating. Consequently, the method allows doping the produced free-form structures with additional substances, and hence inserting further functionalities into the material or producing new functionality. In this case a multiplicity of functional or passive material systems are considered. In this case passive systems describe materials which have a higher or lower refraction index with reference to the polymer of the raw structure. Active components would include light-emitting or non-linear optical or electro-optical active substances. In both cases the materials can be both organic and inorganic in origin and be applied to the raw structure, or respectively introduced into areas near the surface of the raw structure, by different coating methods. These substances can then, by diffusion, be moved deeper into the volume of the structure in a thermal processing step. Consequently, a key advantage of this method is the possibility of introducing substances into the polymeric free-form structure, which is not compatible with the original resist system (polymerizable material or respectively photo resist and the developer adjusted thereto) due to low solubility for example, or would be damaged by the illumination step of the multiple photon absorption. The method according to the invention enables microstructures to be produced out of material combinations, which are not compatible at macroscopic level. It is particularly possible to use dopants which would be damaged by a structuring of the matrix material, using lithographic methods.

Additionally, the method preferably comprises a deposition of a protective layer onto the optical waveguide structure after the heating. Hence the waveguide can be protected in particular against subsequent, undesired mechanical and/or chemical influences.

In a further preferred embodiment the polymerizable material comprises multifunctional (especially bifunctional) polymerizable material in which a multiplicity of orthogonal polymerization mechanisms can be initiated, wherein the local polymerization comprises initiating a first polymerization mechanism before the heating, and wherein the method comprises local initiation of a second polymerization mechanism in the already polymerized material after the heating. Consequently, as described more detailed below based on further, preferred embodiments, a further, a subsequent correction of the waveguide structure can for example be performed or the optical characteristic thereof can be modified by a local influencing of the refraction index.

Overall, the production method according to the invention offers a reduction in surface roughnesses and inhomogeneities in the volume of the free-standing, free-form structure by means of an additional thermal processing step in which the polymeric material is particularly heated above the respective glass transition temperature thereof. In this state the polymeric material is characterized by a rubber-like state, and although it retains the solid aggregate state thereof and therefore the basic structure thereof, yet through the increased ductility thereof allows a re-orienting of individual polymer chains. Also termed "reflow", this processing step therefore allows the structure to achieve a smoothing of the surfaces and therefore an improvement in the material composition in term's of the target application, by means of a thermo-dynamic, more favorable reduction in the surface energy. By means of the same effect, a reduction in mechanical tension in the volume of the material allows a simultaneous improvement in the homogeneity of the polymeric structure. Since the described effects are based on a reduction in the energy and thus in the potential between raw structure and target structure, the process is self-limiting and ends with the achievement of the desired target structure. Additionally, during the reflow process further materials can be introduced into the free-form structure by diffusion.

In the following the invention is described on the basis of examples of preferred embodiments, with reference to the accompanying drawings. In the figures.

Figure 1A:
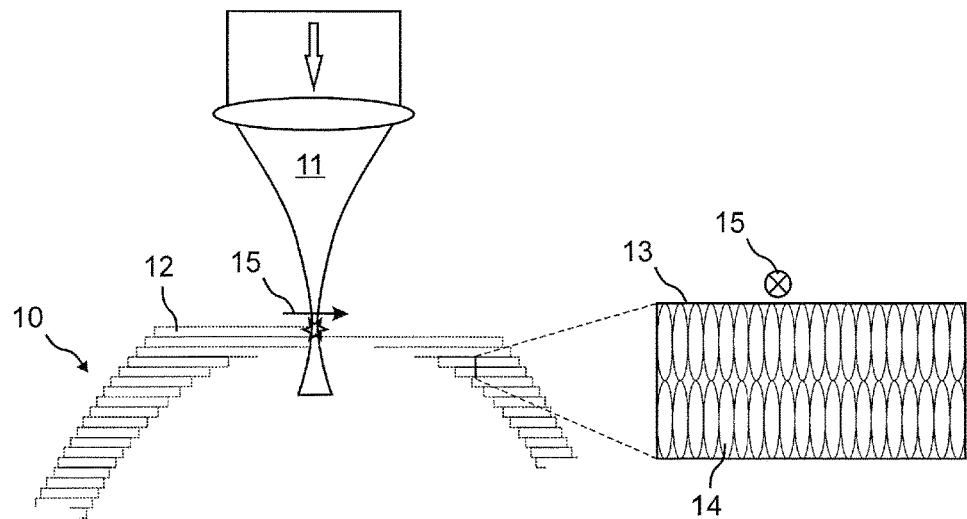
FIG. 1A shows a schematic illustration of an exemplary step of the local polymerization of polymerizable material to produce a multiplicity of polymerized structural elements in a method according to a preferred embodiment of the present invention.

FIG. 1A shows a schematic illustration in an intermediate state of the production of an optical waveguide structure according to a preferred embodiment. In particular, it illustrates an exemplary step of the local polymerization of polymerizable material to produce a multiplicity of polymerized structural elements. For this, in the first instance, preceding the stage shown in FIG. 1, polymerizable material is provided at least in the area in which the optical waveguide is to be formed. For this, a layer of photo resist is deposited for example.

In the preferred embodiment shown, a raw structure 10 is produced by means of a focused laser beam 11 in the photo resist by multiple photon lithography. Therefore, the focus of the laser beam 11 is moved through the photo resist, along a multiplicity of writing lines 12 in succession arranged in a regular grid. Hence, the focus in a way scans, in a grid-like manner, the area in which the waveguide is to be produced. FIG. 1A shows how the focus of the laser is moved straight along a writing direction 15 from left to right, leaving behind in the track thereof a channel with polymerized material as a polymerized structural element. In this way, the laser focus constructs the raw structure 10 of the waveguide to be produced in the volume of the photo resist in layers or respectively in lines.

The cross-section 13 of an already polymerized area of the raw structure 10, shown in the right-hand detail of the image in FIG. 1A shows a cross-section of a multiplicity of polymerized structural elements 14, which for example have been produced one after another by means of the scanning laser focus during the movement thereof along the writing direction 15. It can be seen that the structural elements 14 do not have to fill the volume of the waveguide to be produced completely and continuously (that is, homogeneously) with polymerized material. On the contrary, compared to the target structure 20 shown in FIG. 1B, the raw structure 10 can consist of only a few writing lines 12 with relatively wide distances therebetween. Adjacent structural elements preferably abut each other and can even overlap slightly, in order to ensure sufficient mechanical stability of the raw structure 10 after removal of the non-polymerized material.

After the local polymerization of the photo resist, the illuminated structure can be developed by means of suitable chemical treatment. The free-standing raw structure 10 obtained after a development step here consists of a series of discrete voxel lines 14 which have already been defined by the illumination step. The entire duration of the process for producing the structure is minimized in order to ensure that the raw structure described is constructed with minimized writing time and therefore maximum distances between two adjacent writing lines 12. Minimal writing time refers in this case to just enough illumination time to produce a free-standing, self-supporting basic structure which already has a geometry of shape resembling the target structure, but is still marked by inhomogeneities.

Figure 1B:
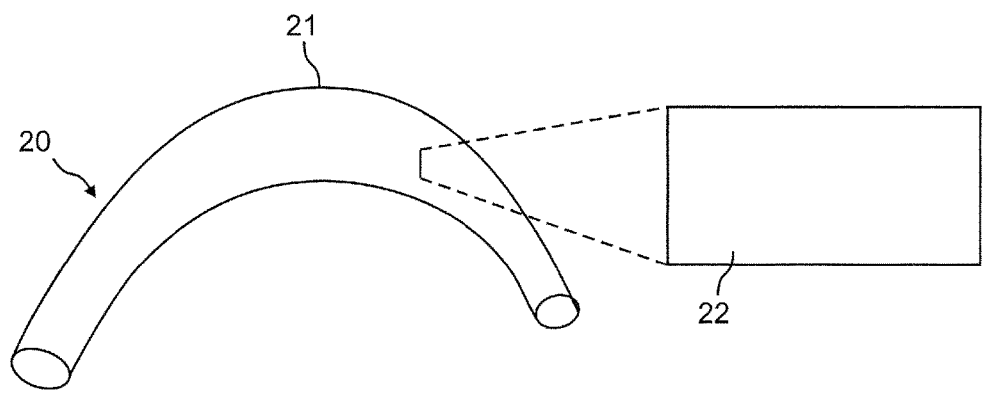
FIG. 1B shows a schematic illustration of a waveguide structure after a heating of the polymerized material in order to fuse the multiplicity of polymerized structural elements together to form the optical waveguide in a method according to a preferred embodiment of the present invention.

After the development, that is, the selective removal of the non-polymerized material, the polymeric raw structure 10 is preferably heated above its glass transition temperature. This allows the polymeric structure to achieve a reduction in surface roughnesses, by reducing the surface energy. A maximum reduction in the surface energy of inhomogeneities in the volume of the structures causes, by means of the same effect, a homogenization of the structure, which corresponds to complete, effective removal of structure details. The outer three-dimensional form of the structure is substantially retained in this process step, since the glass transition temperature in the preferably used thermoplastic polymers is substantially lower than the melting temperature. By means of the self-limiting treatment of the raw structure according to the invention by heating, for example the target structure 20 shown in FIG. 1B is achieved with a substantially smooth surface 21 and a substantially homogeneous interior 22.

In a further preferred embodiment multifunctional (e.g. bifunctional) polymerizable material is used as polymerizable material. Such a correspondingly designed resist (photo resist) could then, in an optional, subsequent process step, be initiated by illumination to perform further networking reactions as a negative resist. With a correspondingly bifunctional photo resist, for example two independent networking reactions, known as orthogonal polymerization reactions, can be initiated deliberately independently from each other. The initiating of the second networking reaction, which follows the multi photon lithography and is particularly carried out after the heating, can here take place thermally and/or optically. Examples of this would be both thermally-induced and photo-induced Diels-Alder cycloadditions and in general radically, anionically or cationically initiated networking of suitably substituted polymer precursors. The target structure obtained by means of this illumination can be further stabilized locally or in the entire basic structure and therefore adopt favorable characteristics in terms of temperature stability or swelling behavior in watery environments.

By locally illuminating the free-form structure 20 (FIG. 1B) by means of this treatment, the refraction index can be locally increased on the surface. Analogous to this, polymeric structures can be produced by means of a targeted selection of the resist system, which polymeric structures can be processed as a positive photo resist, in an illumination step following the thermal processing, whereby illuminated areas become preferably soluble for a further step and can be removed by a suitable developer solution. Thus, this step allows a subsequent correction of the structural details of the free-form structure 20. Moreover, this procedure allows the local surface lowering of the refraction index of the free-form structure.

The heating of the raw structure 10 for transformation into the target structure 20 further allows the doping of the free-form structure by means of thermal diffusion of functional materials. For this, in a further preferred embodiment, the raw structure 10 is coated with a desired material in an additional process step before the heating. As already mentioned above, here a multiplicity of functional or passive material systems are considered.

Following the thermal treatment of the structure for the transformation of the raw structure into the target structure and if necessary for the diffusion of dopant, the structure is again cooled to below the glass transition temperature, whereby the structure solidifies into a glass-like state. A further after-treatment is possible for the passivation of the structure and protection against possible environmental influences. This mechanical and chemical protection is achieved by means of the deposition of various organic and/or anorganic layers (pulsed layer deposition, atomic layer deposition, spincoating or drop casting).

An exemplary realization of the method described here for producing an optical waveguide can be based for example on the structuring of a negative photo resist to produce a thermoplastic polymer by means of two-photon polymerization. Here a radical polymerization of methacrylic acid methyl ester derivatives e.g. is considered as a resist basis. This photo resist preferably contains a sensitizer, such as keto-coumarin 7-diethylamino-3-thionylcoumarin in typical concentrations of below one percent by weight, for the light-induced generation of a radical at half the writing wavelength. In a non-illuminated state this photo resist represents a homogeneous, viscous fluid. This is, by a dropping, spin casting or local dispensing or respectively printing processes, preferably applied to a prefabricated component, on which the optical waveguide is to be produced.

A mode-coupled laser, which with a wavelength of 780 nm, emits optical pulses with a width of 120 fs and a repetition rate of approx. 100 MHz, is preferably used as a light source for the lithography. The pulsed laser beam with a lens of higher numerical aperture (e.g. 100×, NA=1.4) is preferably focused into the resist material. Due to the high peak intensity of the pulsed laser beam, production of the reactive species and hence polymerization occurs in the focus point in an ellipsoid-shaped area. Due to a lateral movement of the sample relative to the focus point or respectively focus point relative to the sample, individual ellipsoids can be combined into complex three-dimensional structures. The lateral resolution of the lithography system perpendicular to the writing beam (laser beam) is given by means of the diameter of the beam in the focus and, depending on the selected dose, is preferably between about 150 nm and about 500 nm. In an axial direction the resolution is preferably between about 600 nm and about 1500 nm. In this case, the laser output is particularly adapted to the writing speed. For a linear relative movement with approx. 200 μm/s of the probe perpendicular to the axis of the writing beam, typically, writing outputs between 10 mW and 20 mW are used.

The polymerized structural elements thereby produced have a line distance between the individual writing lines (i.e. the distance between the center of the structural elements) of about 200 nm to about 500 nm. The target structures of the connecting waveguides preferably have a substantially elliptical cross-section with a small semi-major axis of approx. 2 μm and a large semi-major axis of approx. 3 μm. The surface roughness of the target structure is preferably below 10 nm.

Figure 2A:
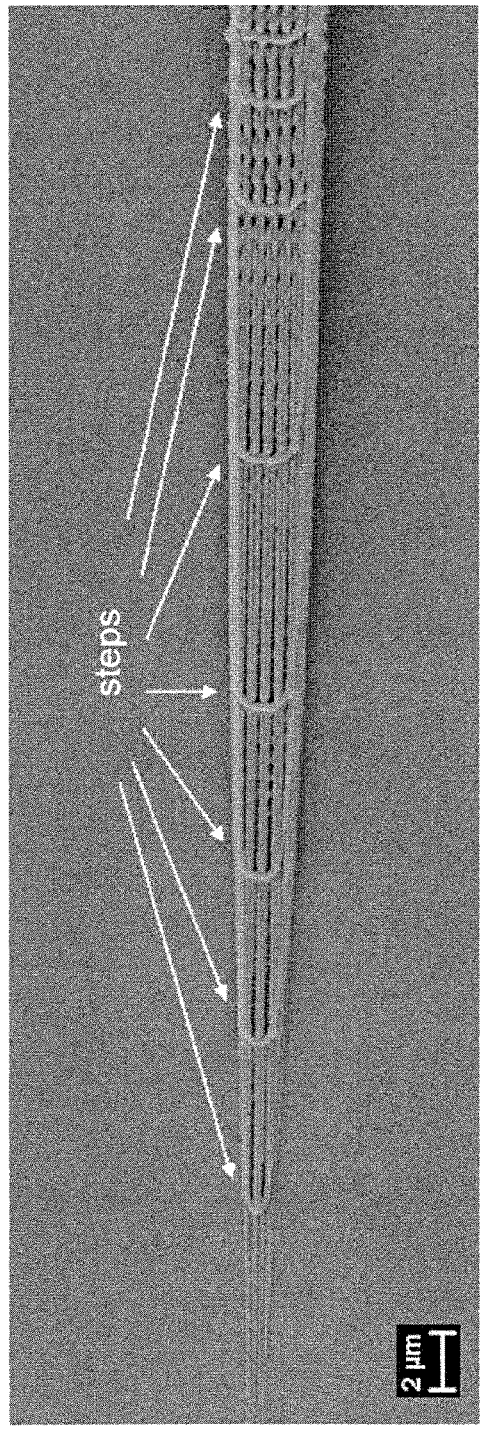
FIG. 2A shows a grid electron-microscope image of a structure in an intermediate state of a method for producing a waveguide structure according to a preferred embodiment of the present invention.
Figure 2B:
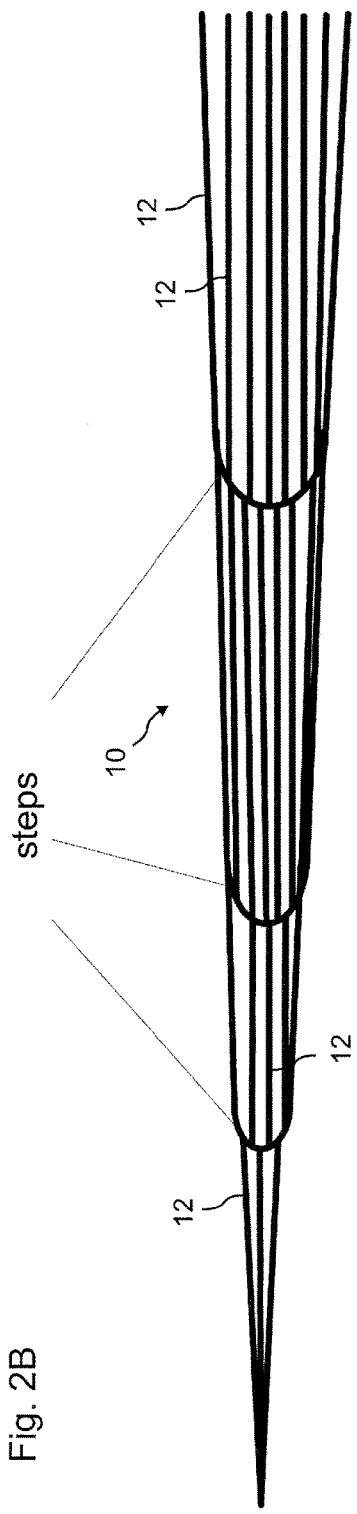
FIG. 2B shows a schematic illustration of the view of a raw structure shown in FIG. 2A, in which individual voxel lines were characterized by way of example.

The raw structure produced by means of the local polymerization is separated from non-illuminated photo resist in a development step. In this case the developing solution is specific to each photo resist used. For the photo resist described in this exemplary application an alkaline developer solution, e.g. a 1% soda solution, is particularly considered. A raw structure produced and developed by means of two-photon polymerization is shown as a grid electron-microscope image in FIG. 2A and illustrated once more as a schematic reproduction of the comparable view of the raw structure 10 in FIG. 2B. Here, the distances between the individual voxel lines 12 can be clearly observed, a roughness of the writing lines can also be observed. In the application as an optical waveguide, this composition would cause significant losses of the guided optical output. If a resist material, which has thermoplastic characteristics in its polymerized state, is used to produce the structure, then the method according to the invention enables a smoothing of the surface and a homogenization of the structure.

Additionally, the structures produced by means of multi photon lithography are heated in a subsequent processing step in particular above the glass transition temperature of the polymeric structure, in the present case approx. 105-120° C. Here, the polymer is in a rubber-like state. In the preferred case the entire component is heated, which can be achieved by means of a hotplate, an oven or by means of a heating lamp. In a particularly preferred embodiment only the polymerized structure concerned is heated. For this, in particular methods are available which allow a locally restricted, selective feed of thermal energy into the resist structure. This can take place by means of, for example, radiation with light in wavelengths which are absorbed particularly well by the resist material, whereas the surrounding material for these wavelengths is transparent or at least absorbs light of this wavelength less. In resist materials with a large proportion of C—H bonds wavelengths of approx. 3390 nm, 1700 nm, 1130 nm or 850 nm are suitable for example, which correspond to the fundamental resonance frequencies or respectively the harmonics of these bonds and therefore the absorption bands of the material. By selecting wavelengths in the infrared range (e.g. 1700 nm), an absorption of the light in the semi-conductor chips to be connected and hence an undesired input of heat can be prevented.

Following the achievement of the target structure by means of the thermal treatment, the component and hence the free-form structure or respectively a number of free-form structures produced on a component, is, by means of a reduction in the component temperature to ambient temperature, transformed into the glass state thereof. This is preferably achieved by an active cooling down of the component by a thermistor or by a passive cooling down on a suitable block of metal, e.g. copper. In a preferred state, the target structure obtained has a surface roughness of no more than 5 nm, in a particularly preferred state a surface roughness of no more than 1 nm. In the particularly preferred state the core (i.e. the interior) of the free-form structure is structureless and thus homogeneous. In the case of a free-form waveguide ("photonic wirebond") the thermally-induced smoothing of the surface or respectively the homogenization in the volume of the material causes a reduction in propagation losses. After the treatment, these are preferably less than 10 dB/mm, most preferably less than 1 dB/mm and altogether most preferably less than 0.1 dB/mm.

An additional functionality of the polymerizable material for the further processing thereof after the thermal treatment (heating) thereof can be realized in the photo resist by means of a chemical configuration of the polymer precursor. The polymer obtained from the methacrylic acid methyl ester derivative can for example be processed by means of methods, such as DUV lithography (deep ultraviolet, λ=240-250 nm), multi photon lithography or electron beam lithography, as a positive resist. Illuminated structure details become soluble in an alkaline developer solution, allowing a correction of structure details. By analogy, further lithography steps can be produced as an additional orthogonal polymerization. As an exemplary embodiment, the photo resist based on methacrylic acid methyl ester can be replaced in part or as a whole by derivatives such as methacrylic acid glycidyl ester.

At this point, together with a corresponding sensitizer, here a photo acid such as OPPI (([4-(octyloxy)phenyl-phenyliodonium hexafluoroantimonate), an orthogonal polymerization reaction to the multi photon lithography can be initiated by suitable illumination (e.g. $\lambda>400$ nm). This reaction preferably causes a chemical cross-linking in the free-form structure and thus increases both the thermal stability of the structure by raising the glass transition temperature and also the chemical stability, and causes a lessening of the swelling behavior of the structure in a liquid environment.

Mentioned above, the doping of the raw structure during the heating thereof can take place by means of passive materials, metal oxides or semi-metal oxides, such as $HfO_2$, MgO, $ZrO_2$, $Al_2O_3$ or $TiO_2$. These materials can be applied to the raw structure in the form of thin layers by means of deposition techniques, such as ALD (atomic layer deposition). However, alternatively, nano particles can be accumulated on the surface of the raw structure and transferred into the interior of the structure by means of thermal diffusion. The accumulation and diffusion can be supported by suitable surface functionalizations of the nano particles. Active materials can be laser dyes, such as rhodamine 6G, fluorescent dyes, such as cyanine 3 (Cy3) or non-linear, optical chromophores such as derivatives of the p-nitroaniline family (push-pull chromophores, in general donor-acceptor substituted $\pi$-electron systems. These materials are preferably applied from a solvent which preferably does not impair the prefabricated polymeric raw structure, or applied to the structure from the vapor phase.

By means of the production method according to the invention, in particular considerable freedom in the geometric design as regards the three-dimensional structure or respectively the course of the optical waveguide structure can be achieved. In this case, the resist system used (polymerizable material) can be used independently of the illumination method as a positive and/or negative resist. The photo resist preferably has bifunctional characteristics as regards the structuring and allows orthogonal polymerization methods to produce and then further process the structure. Consequently, a second networking reaction can be initiated. This is preferably initiated in a dedicated second illumination step. Most preferably, the photo resist (or respectively the polymerizable material) is designed in such a way that a further networking reaction allows the development of coatings. In a further, preferred aspect the further illumination of sections of the target structure 20 allows a local change in the physical and/or chemical characteristics of the waveguide or respectively the waveguide surface 21. The resist system is preferably designed in such a way that the structure produced as a positive resist in a first illumination step can be reworked by means of a second illumination step. This allows in particular the subsequent correction of structure details. In a further, preferred embodiment the resist system is designed in such a way that the refraction index of the structure can, by means of a second illumination, be locally increased or reduced.

As already explained, in a preferred embodiment during the thermal treatment (heating) functional materials are introduced into the volume of the structure by means of temperature-induced diffusion. For this, the material to be deposited is accumulated on the surface of raw structure 10 or respectively deposited by means of a diffusion process in the areas near the surface of structure 10 between the removal of the non-polymerized material (that is, the exposure of the raw structure) and the heating. The materials to be deposited are preferably substances which are highly refractive or low-refractive, light-emitting, nonlinear optical and/or electro-optically active in relation to the resist material that are organic and/or inorganic in origin. Preferably, the materials to be deposited are substances which have no or merely slight solubility in the resist material and which can only be deposited in areas near the surface of the structure via diffusion processes.

REFERENCE LIST

10. Raw structure (multiplicity of structural elements)
11. Illumination system (focused laser beam)
12. Polymerized line element (voxel line)
13. Detail of the cross-section of the raw structure
14. Cross-section of a structural element (voxel line)
15. Writing direction
20. Target structure (waveguide)
21. (Smooth) surface of the target structure
22. Homogeneous structural volume

The invention claimed is:

1. Method for producing an optical waveguide, comprising:
   providing a polymerizable material;
   locally polymerizing the polymerizable material to produce a multiplicity of polymerized structural elements;
   removing non-polymerized areas of the polymerizable material; and
   heating the polymerized material in order to fuse together the multiplicity of polymerized structural elements and to thereby induce smoothing of the surface or homogenization in the volume of the structure, thus forming the optical waveguide.

2. The method according to claim 1, wherein the locally polymerizing is optically induced by multiple photon absorption.

3. The method according to claim 2, wherein the locally polymerizing comprises radiating with focused laser light.

4. The method according to claim 3, wherein the locally polymerizing takes place along a multiplicity of processing lines running parallel to each other in a regular grid within an area of the optical waveguide to be produced.

5. The method according to claim 4, wherein adjacent processing lines have a distance between each other in the range of about 50 nm to about 3 µm.

6. The method according to claim 5, wherein the polymerized structural elements form line elements which have a cross section perpendicular to a longitudinal extension of the line elements, which is in the range of about 100 nm to about 2 µm.

7. The method according to claim 1, wherein the heating comprises heating to a temperature above the glass transition temperature of the polymerized material.

8. The method according to claim 7, including providing an atmosphere with dopant during the heating.

9. The method according to claim 8, further comprising depositing a protective layer onto the optical waveguide structure after the heating.

10. The method according to claim 9, wherein the polymerizable material comprises multifunctional polymerizable material in which a multiplicity of orthogonal polymerization mechanisms can be initiated, wherein the locally polymerizing comprises initiating a first polymerization mechanism before the heating, and wherein the method comprises locally initiating a second polymerization mechanism in the already polymerized material after the heating.

11. The method according to claim 1, wherein the locally polymerizing comprises radiating with focused pulsed laser light.

12. The method according to claim 1, wherein the locally polymerizing takes place along a multiplicity of processing lines running parallel to each other in a regular grid within an area of the optical waveguide to be produced.

13. The method according to claim 12, wherein adjacent processing lines have a distance between each other in the range of about 50 nm to about 3 μm.

14. The method according to claim 1, including providing an atmosphere with dopant during the heating.

15. The method according to claim 1, further comprising depositing a protective layer onto the optical waveguide structure after the heating.

16. The method according to claim 1, wherein the polymerizable material comprises multifunctional polymerizable material in which a multiplicity of orthogonal polymerization mechanisms can be initiated, wherein the locally polymerizing comprises initiating a first polymerization mechanism before the heating, and wherein the method comprises locally initiating a second polymerization mechanism in the already polymerized material after the heating.

17. The method according to claim 1, wherein the polymerized structural elements form line elements which have a cross section perpendicular to a longitudinal extension of the line elements, which is in the range of about 100 nm to about 2 μm.

18. The method according to claim 7, further comprising depositing a protective layer onto the optical waveguide structure after the heating.

19. The method according to claim 7, wherein the polymerizable material comprises multifunctional polymerizable material in which a multiplicity of orthogonal polymerization mechanisms can be initiated, wherein the locally polymerizing comprises initiating a first polymerization mechanism before the heating, and wherein the method comprises locally initiating a second polymerization mechanism in the already polymerized material after the heating.

* * * * *